United States Patent
Jacobs

(10) Patent No.: US 6,897,491 B2
(45) Date of Patent: May 24, 2005

(54) DISPLAY WITH DUMMY EDGE ELECTRODE

(75) Inventor: Boudewijn Johannes Catharinus Jacobs, Heerlen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/501,829

(22) PCT Filed: Dec. 23, 2002

(86) PCT No.: PCT/IB02/05716

§ 371 (c)(1),
(2), (4) Date: Jul. 19, 2004

(87) PCT Pub. No.: WO03/063554

PCT Pub. Date: Jul. 31, 2003

(65) Prior Publication Data

US 2005/0040391 A1 Feb. 24, 2005

(30) Foreign Application Priority Data

Jan. 22, 2002 (EP) ............................................ 02075259

(51) Int. Cl.[7] ........................ H01L 29/22; H01L 29/227
(52) U.S. Cl. ............................................ 257/98; 257/99
(58) Field of Search ................................ 257/81, 98, 99

(56) References Cited

U.S. PATENT DOCUMENTS

2002/0131253 A1 * 9/2002 Kobayashi .................. 361/760

* cited by examiner

Primary Examiner—Ngân V. Ngô

(57) ABSTRACT

In an electroluminescent display device comprising layers of anode electrodes (102), cathode electrodes (104), and an electroluminescent layer (105), a dummy electrode (103) is arranged along the edge of te anode electrode layer. The dummy electrode is unconnected to the electrical control means (106,107) that control the voltage of the electrodes of the active area of the display. The unconnected state of the dummy electrode results in a situation where the dummy electrode attains a floating electric potential owing to the lateral electric field produced by neighboring electrodes. This leads to a reduction in the strength of the lateral electric field between the dummy electrode and the adjacent electrodes, thus alleviating the negative effects of electrochemical oxidation of the electrodes at the edge of the active area.

6 Claims, 2 Drawing Sheets

DISPLAY WITH DUMMY EDGE ELECTRODE

Figure 1:
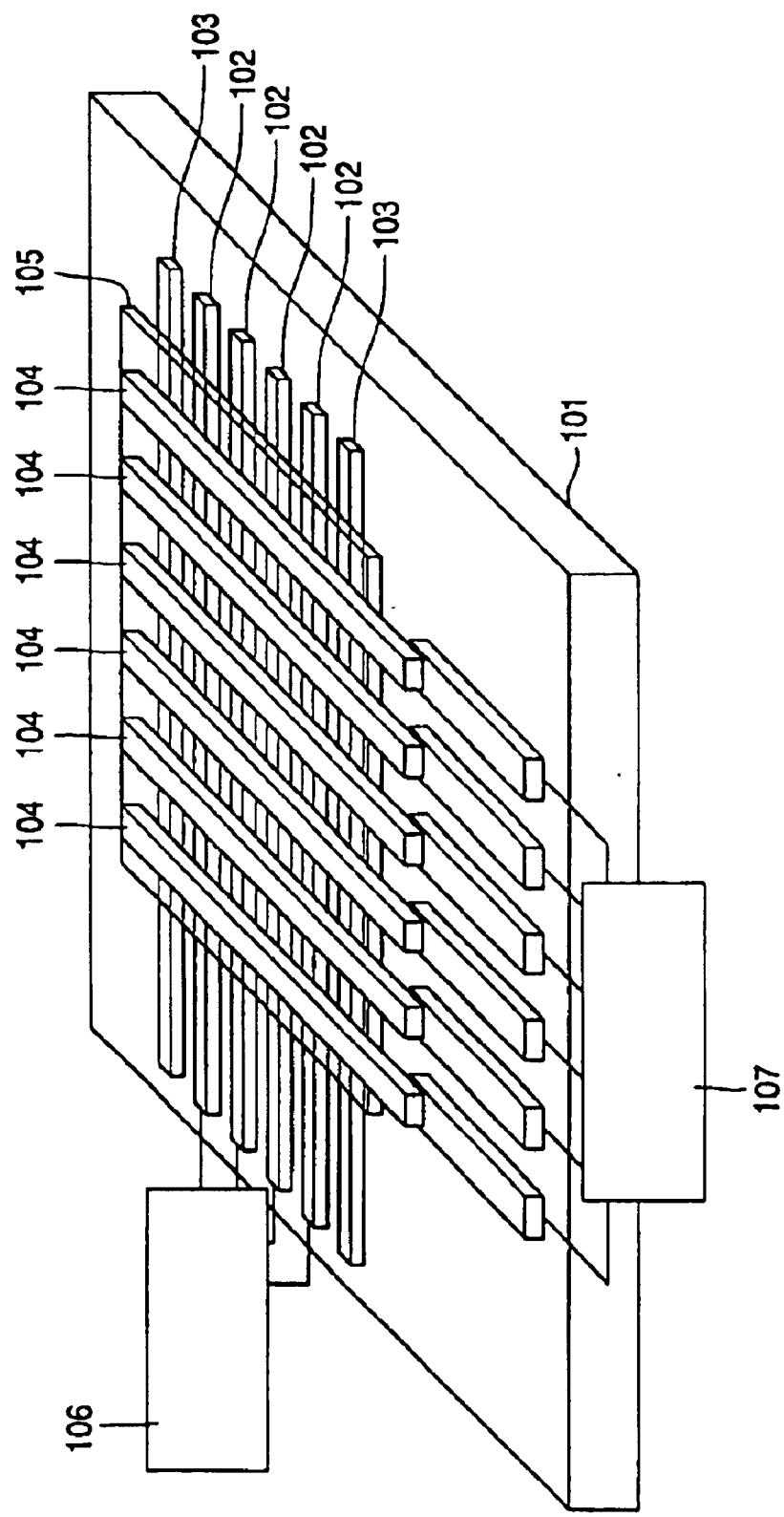

The present invention relates to an electroluminescent device and a display device comprising a first and a second layer of conductive electrodes and an active layer comprising electroluminescent material, said active layer being located between said first and second layers, said electrodes being arranged for connection to respective electrical control means and thereby defining an active area of the display.

Electroluminescent displays according to prior art comprise two flat layers of elongate and parallel conductive electrodes, i.e. an anode layer and a cathode layer. The electrodes are usually arranged to form a matrix of picture elements (pixels) for use in a matrix display device. Commonly, the direction of elongation of the anodes is perpendicular to the direction of elongation of the cathodes, and pixels are formed at the crossings of an anode and a cathode. The electrode layers are produced by techniques known in the art, such as sputtering, evaporation, and lithographic techniques.

An organic electroluminescent layer is located between the electrode layers. Preferably, said organic electroluminescent layer comprises an electroluminescent polymer material. The polymer layer is produced, for example by known spin coating techniques or by an ink-jet printing method. Electrical control means drive the electrodes such that potential differences between anodes and cathodes result in electroluminescence in the organic electroluminescent layer.

A specific prior art device is disclosed in the Japanese patent application having publication number 2000-012238. An organic electroluminescent matrix element comprises a number of elongate parallel electrodes. The voltage of each electrode is controlled such that a desired electroluminescence is obtained in an electroluminescent layer adjacent to the electrodes. A dummy electrode is located at the edge of the parallel electrodes. The voltage of the dummy electrode is controlled such that a reverse voltage, with respect to an adjacent edge electrode, is always present. Due to the reverse voltage, no electroluminescence is obtained via the dummy electrode.

It has been observed that, the light output of the pixels at the edge of the display decreases over a time period which is significantly less than the lifetime of such a matrix display device.

An object of the invention is to overcome the drawbacks related to prior art devices as discussed above. This object is achieved in an inventive manner by a device as claimed in the appended claims.

According to a first aspect, the invention relates to an electroluminescent device comprising a first and a second layer of conductive electrodes and an active layer comprising electroluminescent material, said active layer being located between said first and second layers, said electrodes being arranged for connection to respective electrical control means and thereby defining an active area of the device. The first electrode layer further comprises at least one dummy electrode, said dummy electrode being arranged to be disconnected from said electrical control means and located at least partly along an outer edge of said active area.

An effect of the invention is that it counteracts the negative effects that produce the problem of a reduced lifetime of a display as discussed above. The negative effects are due to an increased potential drop across the electrode located at the edge of the active area. The potential drop leads to a decrease in potential difference across the electroluminescent layer, resulting in a decreased light output from the electroluminescent material between the cathode and anode layers.

The potential drop across the electrode is probably due to an increased internal resistance caused by electrochemical oxidation of the material in the electrode. It can be noted that the rate of electrochemical oxidation of the edge electrode is dependent on the strength of the lateral electric field (i.e. perpendicular to the direction of elongation of the electrode) present at the edge.

Hence, in order to reduce the strength of such a lateral electric field at the edge electrode, a dummy electrode is arranged along the edge of the active area of the display. The dummy electrode is disconnected from the electrical control means that control the voltage of the electrodes of the active area of the display. The unconnected state of the dummy electrode results in a situation where the dummy electrode attains a varying electric potential i.e. a floating potential, owing to the lateral electric field produced by neighboring electrodes. This leads to a reduction in the strength of the lateral electric field between the dummy electrode and the adjacent electrodes of the active area, thus alleviating the negative effects of electrochemical oxidation of the electrodes at the edge of the active area.

An advantage of the present invention is that it increases the lifetime of an electroluminescent display device. That is, the deterioration rate of the anode electrodes at the edge of the active area becomes comparable to the deterioration rate of the anode electrodes within the active area, hence leading to an even light output across the active area.

In an embodiment of the invention, the dummy electrode is totally disconnected from any conductor, thereby providing an advantage of being very simple to manufacture.

Although the invention as stated above relates to a device of any geometrical shape, a preferred embodiment is that of a matrix configuration, while at the same time the dummy electrode is of the same shape and geometrical extent as the electrodes of the active area.

Such an embodiment also has the advantage that is more simple to manufacture. Furthermore, it allows to provide dummy electrodes with reduced size for reasons of space reduction. A smaller shaped dummy electrode has the advantage of a smaller passive area (and thus smaller device) than the dummy electrode of the same shape.

Moreover, by suitably selecting a polymer material, such as polyethylenedioxythiophene, as a constituent part of the material, of the electrodes, an efficient electroluminescence can be obtained.

For reason of clarity, the EL device comprises one or more functional layers. Examples of such functional layers are an electroluminescent, charge transport and charge injecting layers. In order to fully exploit the benefits of the invention, the one or more functional layers are preferably provided using a wet deposition method.

The one or, if there is more than one, at least one of the functional layers is an electroluminescent layer. The EL layer is made of a substantially, preferably organic, electroluminescent material. In the context of the invention, the type of EL material used is not critical and any EL material known in the art can be used. Preferably, however obtainable from a fluid which can be deposited using a wet deposition method. Suitable organic EL materials include organic photo- or electroluminescent, fluorescent and phosphorescent compounds of low or high molecular weight. Suitable low molecular weight compounds are well known in the art and include tris-8-aluminium quinolinol complex and coumarins. Such compounds can be applied using vacuumdeposition method. Alternatively, the low molecular weight compounds can be embedded in a polymer matrix or chemically bonded to polymers, for example by inclusion in the main chain or as side-chains, an example being polyvinylcarbazole.

Preferred high molecular weight materials contain EL polymers having a substantially conjugated backbone (main chain), such as polythiophenes, polyphenylenes, polythiophenevinylenes, or, more preferably, poly-p-phenylenevinylenes. Particularly preferred are (blue-emitting) poly(alkyl)fluorenes and poly-p-phenylenevinylenes which emit red, yellow or green light and are 2-, or 2,5- substituted poly-p-phenylenevinylenes, in particular those having solubility-improving side groups at the 2- and/or 2,5 position such as $C_1$–$C_{20}$, preferably $C_4$–$C_{10}$, alkyl or alkoxy groups. Preferred side groups are methyl, methoxy, 3,7-dimethyloctyloxy, and 2-methylpropoxy. More particularly preferred are polymers including a 2-aryl-1,4-phenylenevinylene repeating unit, the aryl group being optionally substituted with alkyl and/or alkoxy groups of the type above, in particular methyl, methoxy, 3,7-dimethyloctyloxy, or, better still, 2-methylpropoxy. The organic material may contain one or more of such compounds. Such EL polymers can suitably be applied by wet deposition techniques.

In the context of the invention, the term organic includes polymeric whereas the term polymer and affixes derived therefrom, includes homopolymer, copolymer, terpolymer and higher homologues as well as oligomer.

Optionally, the organic EL material contains further substances, organic or inorganic in nature, which may be homogeneously distributed on a molecular scale or present in the form of a particle distribution. In particular, compounds improving the charge-injecting and/or charge-transport capability of electrons and/or holes, compounds to improve and/or modify the intensity or color of the light emitted, stabilizers, and the like may be present.

The organic EL layer preferably has an average thickness of 50 nm to 200 nm, in particular, 60 run to 150 nm or, preferably, 70 nm to 100 nm.

Optionally, the EL device comprises further, preferably organic, functional layers disposed between the electrodes. Such further layers may be hole-injecting and/or transport (HTL) layers and electron-injecting and transport (ETL) layers. Examples of EL devices comprising more than one functional layer are a laminate of anode/HTL layer/EL layer/cathode, anode/EL layer/ETL layer/cathode, or anode/HTL layer/EL layer/ETL layer/cathode.

Suitable materials for the hole-injecting and/or hole-transport layers (HTL) include aromatic tertiary amines, in particular diamines or higher homologues, polyvinylcarbazole, quinacridone, porphyrins, phthalocyanines, poly-aniline and poly-3,4-thylenedioxythiophene.

Suitable materials for the electron-injecting and/or electron-transport layers ETL) are oxadiazole-based compounds and aluminiumquinoline compounds.

If ITO is used as the anode, the EL device preferably comprises a 50 to 300 nm thick layer of the hole-injecting/-transport layer material poly-3,4 thylenedioxythiophene or a 50 to 200 nm thick layer of polyaniline.

Generally, the EL device comprises a substrate. Preferably, the substrate is transparent with respect to the light to be emitted. Suitable substrate materials include transparent synthetic resin which may or may not be flexible, quartz, ceramics and glass. The substrate provides the supporting surface for the relief pattern.

Although in its broadest sense, the invention is applicable to EL devices having a single electroluminescent area, the invention is particularly beneficial for an electroluminescent device comprising a plurality of light emitting areas. The accompanying sections have the function of preventing functional layer material from being deposited in the wrong light emitting are and/or in areas where no light emission is to occur.

For display purposes, the separate light emitting areas are referred to as EL elements or pixels and are generally independently addressable. Each EL element has an area capable of light emission. The light emissive area is part of the EL layer. A light emissive area is formed by the area of overlap of a first electrode, a second electrode, and an organic EL layer. The EL device may be a segmented or matrix display device of the passive or active type.

The first electrode layer may be electron-injecting and the second electrode layer hole-injecting. Alternatively, the first electrode layer is hole injecting and the second electrode layer is electron injecting.

An electron-injecting electrode is suitably made of a metal(alloy) having a low work function, such as Yb, Ca, Mg:Ag Li:Al, Ba or is a laminate of different layers such as Ba/Al or Ba/Ag electrode.

A hole-injecting electrode is suitably made of a metal (alloy) having a high work function such as Au, Pt, Ag. Preferably, a more transparent hole-injecting electrode material, such as an indiumtinoxide (ITO), is used. Conductive polymers such as a polyaniline (PANI) and a poly-3,4-ethylenedioxythiophene (PEDOT) are also suitable transparent hole-injecting electrode materials. Preferably, a PANI layer has a thickness of 50 to 200 nm, and a PEDOT layer 100 to 300 nm. If an ITO hole-injecting electrode is used, the first electrode is preferably the hole-injecting electrode.

According to a second aspect of the present invention, a display device is provided. The display device comprises a substrate layer on which a first and a second layer of conductive electrodes and an active layer comprising electroluminescent material are arranged, said active layer being located between said first and second layers, said electrodes being connected to electrical control means and thereby defining an active area of the display. The first electrode layer further comprises at least one dummy electrode, said dummy electrode being disconnected from said electrical control means and located at least partly along an outer edge of said active area.

The technical effects and advantages of such a device have been discussed with reference to the electroluminescent device above.

Figure 2:
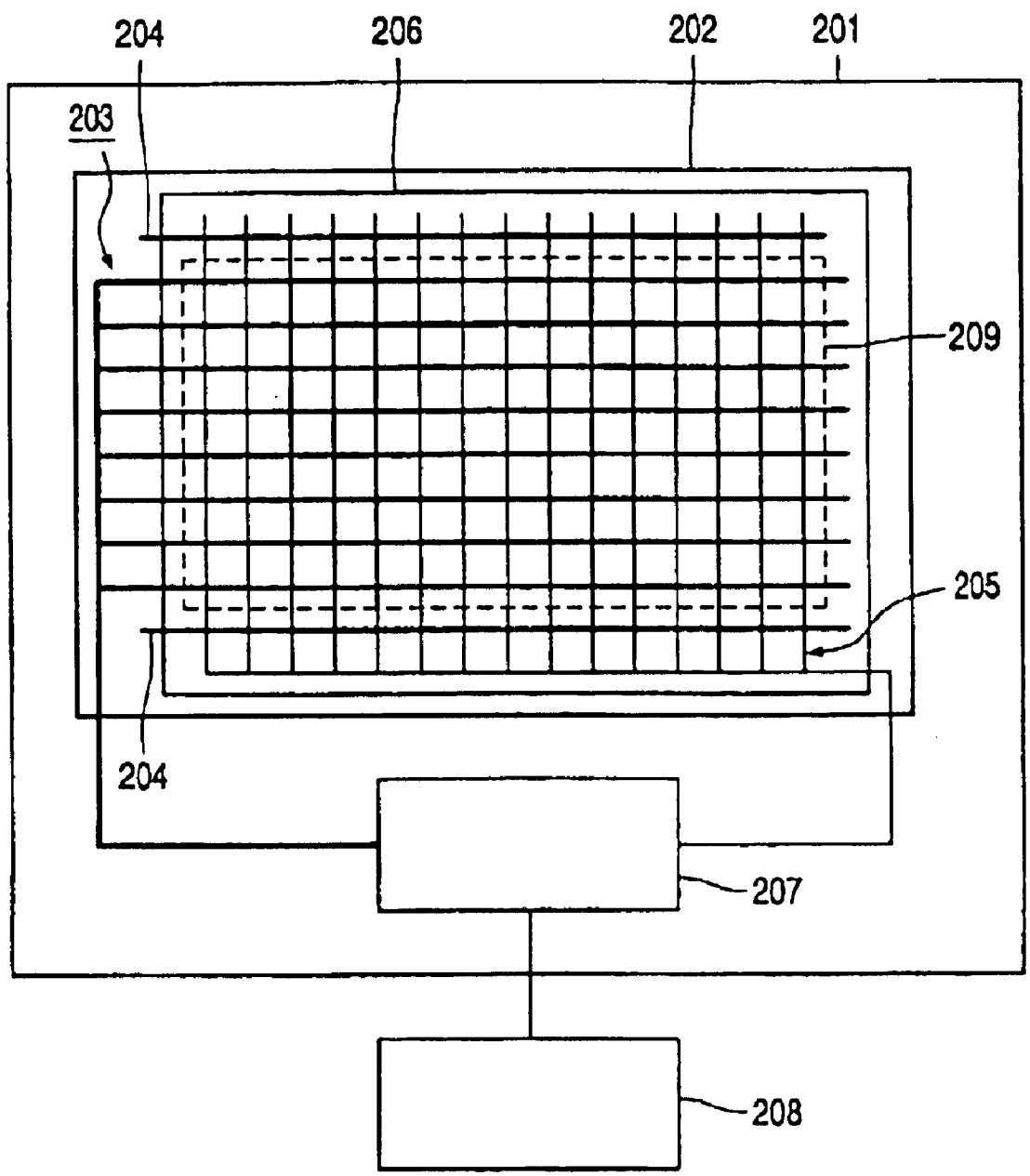

The invention will now be described in terms of preferred embodiments, and reference will be made to the drawings, where:

FIG. 1 is a diagrammatic a perspective view of an electroluminescent device according to the invention, and FIG. 2 is a diagram of a display device according to the invention.

FIG. 1 illustrates diagrammatically an embodiment of an electroluminescent device according to the invention. The device comprises a substrate 101, which may be of any material known in the art, including glass materials, and may be appropriately chosen by the skilled person. On the substrate 101 are located a number of parallel anode electrodes 102, i.e. an anode electrode layer. Although only a few are illustrated in FIG. 1, the skilled person will realize that the number of anode electrodes 102 may be much greater and counted in hundreds, if not thousands. Moreover, the anode electrodes 102 are produced by techniques known to the skilled person, such as sputtering, evaporation, and lithographical techniques and may consist at least partly of a polymer material, for example polyethylenedioxythiophene.

The anode electrodes 102 are all connected to an anode control unit 106 which provides electric voltages to the anode electrodes 102, as the skilled person realizes.

On the anode electrodes 102 there is an electroluminescent layer 105. The electroluminescent layer 105 is manufactured in a manner known to the skilled person and is, for example, of an appropriately chosen polymer material.

On the electroluminescent layer 105 are located a number of parallel cathode electrodes 104. As for the anode electrodes 102 discussed above, only a few are illustrated in FIG. 1, and the skilled person will realize that the number may be much greater. Moreover, the cathode electrodes 104 are also produced by techniques known to the skilled person, such as sputtering, evaporation, and lithographical techniques.

The cathode electrodes 104 are all connected to a cathode control unit 107 which provides electric voltages to the cathode electrodes 104, as the skilled person realizes, and in combination with the anode control unit 106 drives the electrodes such that potential differences between anode electrodes and cathode electrodes result in electroluminescence in the electroluminescent layer 105.

The layer comprising anode electrodes 102 further comprises two dummy anode electrodes 103 which are not connected to the anode electrode control unit 106. These dummy anode electrodes 103 are located adjacent to the anode electrodes 102.

The effect of these unconnected dummy anode electrodes 103 is that their presence counteracts the negative effects that produce the problem of reduced lifetime of a display as discussed above. The negative effects are due to a strong lateral electric field at the edge anode electrodes 102 located adjacent to the dummy anode electrodes 103. Without the presence of the dummy anode electrodes 103, the strong lateral electric field would lead to an increased deterioration rate and hence a decrease in potential difference across the electroluminescent layer 105, resulting in a decreased light output, as was discussed above.

In FIG. 2, a second embodiment of the present invention is diagrammatically shown. A display unit 201 is shown suitable for use in a computer, mobile communication terminal, or indeed in any electronic equipment that requires a display screen. For simplicity, the equipment to which the display unit 201 is connected is illustrated as a generic user unit 208 in FIG. 2.

The display unit comprises an electroluminescent device as described above with reference to FIG. 1. This is a device on a substrate 202, in which an electroluminescent layer 206 is located between layers of anode electrodes 203 and cathode electrodes 205. A control unit 207 controls, in cooperation with the user equipment 208, the voltages applied to the anode electrodes 203 and the cathode electrodes 205 in such a manner that an active area 209 is obtained.

The layer comprising anode electrodes 203 further comprises two dummy anode electrodes 204 that are not connected to the control unit 207. These dummy anode electrodes 204 are located adjacent to the anode electrodes 203 at the edges of the active area 209, resulting in the effect that the lifetime of the anode electrodes 203 at the edge of the active area 209 is increased.

Finally, in summary, an electroluminescent display device has been described, comprising layers of anode electrodes, cathode electrodes, and an electroluminescent layer, a dummy electrode being arranged along the edge of the anode electrode layer. The dummy electrode is disconnected from to the electric control means that control the voltage of the electrodes of the active area of the display. The unconnected state of the dummy electrode results in a situation where the dummy electrode attains a floating electric potential owing to the lateral electric field produced by neighboring electrodes. This leads to a reduction in the strength of the lateral electric field between the dummy electrode and the adjacent electrodes, thus alleviating the negative effects of electrochemical oxidation of the electrodes at the edge of the active area. Herewith it is achieved that during operation of the device the light intensity at the edge of the device is maintained at the original level. The problem of pixel shrinkage is therewith at least substantially reduced. Also, an extension of the lifetime is obtained.

What is claimed is:

1. Electroluminescent device comprising a first and a second layer of conductive electrodes (102,104,203,205) and an active layer comprising electroluminescent material (105,206), said active layer being located between said first and second layers, said electrodes being arranged for connection to respective electrical control means (106,107,207) and thereby defining an active area (209) of the device, characterized in that the first electrode layer further comprises at least one dummy electrode (103,204), said dummy electrode being arranged to be disconnected from said electrical control means and located at least partly along an outer edge of said active area.

2. An electroluminescent device as claimed in claim 1, said at least one dummy electrode being arranged so as to be unconnected to any conductor.

3. An electroluminescent device as claimed in claim 1, said electrodes of the first layer being elongate and substantially parallel, said electrodes of the second layer being elongate and substantially parallel, said electrodes of the first layer being substantially perpendicular to the electrodes of the second layer, thereby defining a matrix display, and said at least one dummy electrode being elongate and substantially parallel to the electrodes of the first layer.

4. An electroluminescent device as claimed in claim 3, said dummy electrode being substantially of equal spatial extent as the electrodes of the first layer.

5. An electroluminescent device as claimed in claim 1, said electrodes of the first layer comprising polyethylenedioxythiophene.

6. A display device (201) comprising a substrate layer (202) on which a first and a second layer of conductive electrodes (203,205) and an active layer comprising electroluminescent material (206) are arranged, said active layer being located between said first and second layers, said electrodes being connected to electrical control means (207) and thereby defining an active area (209) of the display, characterized in that the first electrode layer further comprises at least one dummy electrode (204), said dummy electrode being disconnected from said electrical control means and located at least partly along an outer edge of said active area.

* * * * *